United States Patent [19]
Roberts

[11] B 3,991,460
[45] Nov. 16, 1976

[54] METHOD OF MAKING A LIGHT ACTIVATED SEMICONDUCTOR CONTROLLED RECTIFIER

[75] Inventor: John S. Roberts, Export, Pa.

[73] Assignee: Westinghouse Electric Corporation, Pittsburgh, Pa.

[22] Filed: Mar. 25, 1975

[21] Appl. No.: 561,732

[44] Published under the second Trial Voluntary Protest Program on February 3, 1976 as document No. B 561,732.

Related U.S. Application Data

[63] Continuation-in-part of Ser. No. 392,698, Aug. 29, 1973, Pat. No. 3,920,495, which is a continuation-in-part of Ser. No. 248,451, Sept. 28, 1972, abandoned.

[52] U.S. Cl. .................................. 29/578; 29/580; 29/590; 357/30
[51] Int. Cl.² .................................. B01J 17/00
[58] Field of Search ..................... 29/578, 580, 590; 156/17; 252/79.3

[56] References Cited
UNITED STATES PATENTS

| | | | |
|---|---|---|---|
| 2,593,447 | 4/1952 | Hesch | 252/79.3 |
| 3,088,888 | 5/1963 | Leff | 156/17 |
| 3,107,188 | 10/1963 | Hancock | 156/17 |
| 3,389,457 | 6/1968 | Goldman | 29/580 |
| 3,466,510 | 9/1969 | Mauta | 29/580 |

*Primary Examiner*—W. Tupman
*Attorney, Agent, or Firm*—C. L. Menzemer

[57] ABSTRACT

A method is provided for making a light activated semiconductor controlled rectifier in a semiconductor body having opposed first and second major surfaces. Impurities are sequentially provided in the major surfaces to form four regions of alternate type conductivity disposed alternatively through the body between the major surfaces, with a PN junction between each region. An etchant solution is prepared preferably substantially equal amounts of chromium trioxide and water, and adding to said first solution just prior to use a given, preferably about 50% hydrofluoric acid solution in predetermined amounts preferably of substantially one part for each two parts of the first solution. All surfaces, except the first major surface of the diffused semiconductor body is masked with a material resistant to hydrofluoric acid, and the masked semiconductor body is immersed in the etchant solution to form light radiation reflecting pits, preferably in a tetrahedral pattern, in at least portions of the first major surface. A first electrode having an opening therethrough corresponding to a desired light radiation reflective means is formed on the first major surface, preferably before the immersion of the masked semiconductor body in the etchant solution, so that the etched pits are formed in the first major surface only where the light radiation reflective means is desired. The controlled rectifier is completed by forming on the second major surface a second electrode having an opening therethrough adapted to permit light radiation of preselected wavelength to penetrate the body and reflect from the light radiation reflective means.

10 Claims, 9 Drawing Figures

METHOD OF MAKING A LIGHT ACTIVATED SEMICONDUCTOR CONTROLLED RECTIFIER

GOVERNMENT CONTRACT

This invention was made in the course or under United States Government Contract No. N00039-71-C-0228.

RELATED APPLICATIONS

This application is a continuation-in-part of copending application Ser. No. 392,698, filed Aug. 29, 1973, now pat No. 3,920,495 which was a continuation-in-part of then copending, now abandoned, application Ser. No. 248,451, filed Apr. 28, 1972.

FIELD OF THE INVENTION

The present invention relates to semiconductor devices particularly semiconductor controlled rectifiers gated by light radiation.

BACKGROUND OF THE INVENTION

The present invention is an improvement on the invention described and claimed in U.S. Pat. No. 3,590,344, granted June 29, 1971, to the same applicant and the saame assignee as the present invention. Specifically, the present invention provides an improved method of making the light activated semiconductor controlled rectifier described and claimed in U.S. Pat. No. 3,590,344.

Semiconductor controlled rectifiers (SCR), sometimes called "thyristors", are non-linear, solid state devices that are bistable. That is, they have both high and low impedance states. They commonly have four-layer, PNPN structures. Semiconductor controlled rectifiers are usually switched from the high impedance state to the low impedance state by means of a control or gating signal applied to the cathode-base region of the device. Semiconductor controlled rectifiers can also be gated by light radiation incident on the base regions.

Light activated semiconductor controlled rectifiers are well-known for their efficient switching capabilities. The incident light generates electron-hole pairs in the vicinity of the reverse bias center PN junction which instead of recombining, are swept across the junction and increase the anode to cathode current. This current increases with increased light, increasing the current gain of the PNP and NPN transistor equivalents of the structure. If the photocurrent is high enough, it will switch the silicon controlled rectifier from the high impedance blocking state, to the low impedance conducting state.

A major problem with such light activated silicon controlled rectifiers is rapid generation of sufficient photocurrent to gate the device. A standard four-layer semiconductor controlled rectifier can have its base regions directly light irradiated only at the edges along the periphery of the semiconductor body. Such "edge-fired" devices, however, have a very small area sensitive to the incident light and in turn have a relatively long switching time or current rise time on turn-on, i.e. the time required to switch from the blocking mode to conducting mode. Further, encapsulation of such "edge-fired" devices is difficult.

The sensitive area has been greatly increased by irradiating the base regions through the cathode emitter. That is, light with wavelengths in the very near infrared penetrate through the cathode-emitter region to generate electron-hole pairs deep in the interior regions of the device. Moreover, the light is preferably of a wavelength which partially passes entirely through the four conductive regions of the semiconductor body, and reflects from reflective means disposed in the opposite major surface of the body. The light energy is thus reflected back into the semiconductor body and is further absorbed to generate increased electron-hole pairs through a larger volume of the body, see U.S. Pat. No. 3,590,344. The wide distribution of the light through the body causes a larger area of the device to be initially turned-on, increasing the dI/dt capability and decreasing the turn-on time of the SCR.

A fundamental problem with such light activated semiconductor controlled rectifiers has been the making of the light radiation reflective means. A simple method of etching the reflective means into the semiconductor body is described in the parent applications. However, that method was not fully satisfactory. Deterioration of the reflectivity of the etched surface occurred in the subsequent alloying step. In addition, alloy would occasionally funnel along the etched dislocations during the alloying step and short-out the reverse blocking junction of the semiconductor controlled rectifier.

The present invention overcomes these difficulties and disadvantages. It provides a method of making the light activated semiconductor controlled rectifier described in U.S. Pat. No. 3,590,344 without reducing the quantative yield of the device.

SUMMARY OF THE INVENTION

A method is provided for making a light activated semiconductor controlled rectifier by first sequentially providing in a silicon semiconductor body impurities of alternate conductivity type through opposed first and second major surfaces of said body. Four regions of alternate type conductivity are thus disposed alternately through the semiconductor body between the first and second major surfaces, with a PN junction between each region. In turn, the four impurity regions form two emitter regions adjoining the respective major surfaces, and two base regions intermediate between said emitter regions.

An etchant solution is prepared by first forming a first solution by admixing chromium trioxide and water in predetermined amounts and preferably substantially equal amounts. A given hydrofluoric acid solution, preferably of substantially equal parts of acid and water (e.g. 48–49% solution), is then added to the first solution just prior to use in predetermined amounts and preferably in substantially one part for each two parts of the first solution.

All surfaces of the semiconductor body, except for the first major surface, are masked with a material resistant to hydrofluoric acid. The masked semiconductor body is thereafter immersed in the etchant solution for a preselected period of time, while the solution is agitated relative to the body, to form light radiation reflecting etch pits in at least a portion of the major surface. Preferably the first major surface is crystallographically oriented in the (111) plane and in turn the etch pits are formed in tetrahedral patterns.

Preferably prior to etching, a first electrode is formed on the first major surface to make ohmic contact to the emitter region adjoining the first major surface. The electrode has a central opening therethrough corresponding to a desired light radiation reflective means for the body. The electrode in turn selectively masks the first major surface so that on immersion in the etchant solution, the light radiation reflecting etch pits are formed only on preselected portions of the first major surface corresponding to the desired light reflective means.

Alternatively, the first electrode is formed on the first major surface after the immersion in the etchant solution. The light radiation reflecting etch pits thus are formed over the entirety of the first major surface, and the etch pits are thereafter selectively degraded on application and alloying of the first electrode to the first major surface. The light radiation reflective means is thus formed in the portion of the first major surface corresponding to the central opening through the first electrode.

Thereafter, the light activated semiconductor controlled rectifier is completed by removing from the surfaces of the semiconductor body the material resistant to hydrofluoric acid, and forming on the second major surface a second electrode to make ohmic contact to the emitter region adjoining the second major surface. The second electrode also has an opening therethrough corresponding to the light radiation reflective means in the body at the opposite portions of the first major surface. This opening is adapted to permit the light radiation of preselected wavelengths to penetrate the semiconductor body therethrough and impinge on the light radiation reflective means, from where the light is reflected at an angle outwardly through the body.

Preferably formed over the light radiation reflective means on the first major surface, most desirably simultaneously with the second electrode, is a light reflecting material to assist in reflection of light radiation from the reflective means.

Other details, objects and advantages of the invention will become apparent as the following description of the presently preferred embodiments and presently preferred methods of performing the same proceeds.

BRIEF DESCRIPTION OF THE DRAWINGS

In the accompanying drawings, the presently preferred embodiments of the invention and presently preferred methods of performing the invention are illustrated, in which.

DESCRIPTION OF THE PREFERRED EMBODIMENTS

Figure 1:
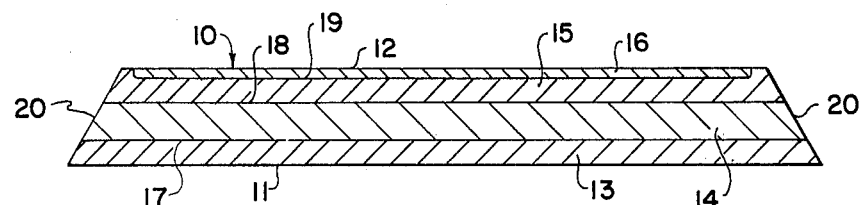
FIGS. 1 through 3 are cross-sectional views in elevation of a light-activated semiconductor controlled rectifier in various stages of fabrication in accordance with the present invention.

Referring to FIG. 1, semiconductor body 10 is provided for forming the light-activated semiconductor controlled rectifier in accordance with the present invention. Semiconductor body 10 is typically a commercially available single crystal silicon wafer having a thickness typically between 8 and 20 mils, and having first and second opposed major surfacts 11 and 12 preferably in the (III) crystallographic orientation. Sequentially provided in body 10 is suitable impurities, for example as hereinafter described, to form four impurity regions 13, 14, 15 and 16 of alternate type conductivity disposed alternately through the body between major surface 11 and major surface 12, with PN junctions 17, 18 and 19 between regions 13 and 14, 14 and 15, and 15 and 16, respectively. Impurity regions 13 and 16 adjoin major surfaces 11 and 12, respectively, to form the anode-emitter and the cathode-emitter regions of the semiconductor controlled rectifier, respectively, and impurity regions 14 and 15 are disposed in body 10 intermediate to form the anode-base and the cathode-base regions of the silicon controlled rectifier, respectively.

The semiconductor controlled rectifier is typically made by commercially obtaining the semiconductor body 10 uniformly doped with an N-type impurity, such as phosphorus or arsenic, to a concentration typically between about $5 \times 10^{13}$ and $5 \times 10^{14}$ atoms/cm$^3$, i.e. 200 to 10 ohm-cm. Body 10 is then typically diffusion doped with a P-type impurity such as boron, gallium or aluminum through major surfaces 11 and 12 by a standard diffusion technique, and the diffusion driven by a standard heating technique to a specified depth (e.g. 50 to 75 microns) to simultaneously form anode-emitter and cathode-base regions 13 and 15. Anode-base region 14 is formed at the same time between regions 13 and 15 by the residual N-type impurity of the body with a thickness (e.g. 150 to 250 microns) depending upon the desired voltage rating. Anode-emitter and cathode-base regions 13 and 15 have surface impurity concentrations of typically between about $5 \times 10^{15}$ and $1 \times 10^{18}$ atoms/cm$^3$. If desired, to reduce bulk resistivity, second major surface 12 may be masked and the diffusion continued to raise the impurity concentration of the anodeemitter region 13 adjacent major surface 11 to at least $1 \times 10^{18}$ atoms/cm$^3$. Alternatively, impurity regions 13, 14, 15 and 16 may be formed by epitaxial growth or a combination of epitaxial growth and diffusion.

After the initial diffusion, first and second major surfacws 11 and 12 are masked with the standard diffusion mask such as silicon dioxide. Typically, this masking is accomplished by heating body 10 in an oxygen-rich atmosphere such as steam to about 1200°–1250°C. for three to four hours. A window pattern suitable for forming cathode-emitter region 16 is then opened in the masking layer covering surface 12 by standard photolithographic and etching methods. Cathodeemitter region 16 is then diffused into body 10 through the opened window pattern and major surface 11 by diffusion of N-type impurity such as phosphorus by a standard diffusion method. The cathode-emitter region 16 is thus provided with a surface concentration typically of about $1 \times 10^{19}$ to $1 \times 10^{21}$ atoms/cm$^3$ and a depth typically of about 10 to 15 microns.

To complete the making of the controlled rectifier structure, body 10 is spin-etched by known procedures to taper side surfaces 20 and shape the electric fields in the controlled rectifier on operation, and in turn further reduce edge leakage and localized surface breakdown during operation. This tapering is important to reduce surface breakdown. The tapering of side surfaces 20 may be performed immediately after the diffusion, or alternatively, later in the manufacture of the device to avoid contamination and deterioration of the etched surfaces.

Figure 2:
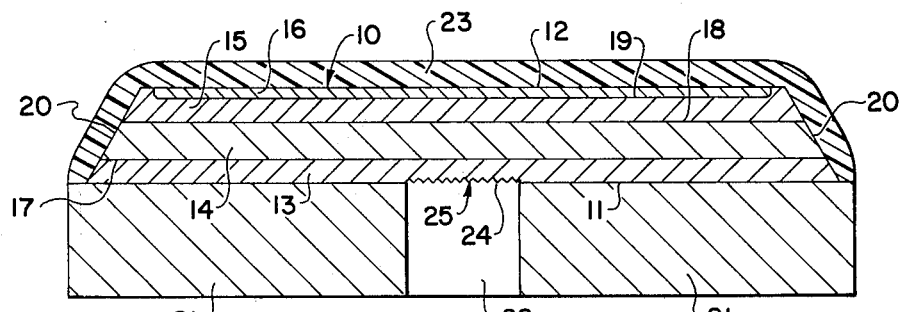

Referring to FIG. 2, body 10 with the silicon controlled rectifier structure diffused therein, is disposed on anode electrode 21, typically of molybdenum or tungsten, with first major surface 11 in contact with a major surface of electrode 21. Electrode 21 is usually separately formed in a circular shape at least as large as semiconductor body 10 and has opening 22 typically centrally therethrough corresponding in size to a desired light radiation reflective means for the body. Electrode 21 is alloyed to first major surface 11 by heating electrode 21 and body 10 in intimate contact in an inert atmosphere to a temperature typically of about 680°C. In this way, electrode 21 makes ohmic contact with anode-emitter region 13 across the entire major surface 11 except for opening 22.

Typically, the exposed surfaces of body 10 are then cleaned to prepare the exposed portions of surface 11 at opening 22 for etching. The body may be cleaned by any suitable procedure such as dipping in acetone, and then rinsing in deionized distilled water.

All surfaces, i.e. surfaces 12 and 20, of body 10 except for the exposed portion of first major surface 11 at opening 22, are then covered with masking layer 23 of a suitable material that is resistant to hydrofluoric acid. Found particularly suitable for this purpose is Apiezon$^{TM}$ wax, which is a hydrocarbon based ester derived from select distillation fractions of petroleum oil and greases and which is distributed by James G. Biddle Company, Plymouth Meeting, Pennsylvania. Body 10 is then immersed in hydrofluoric acid solution (e.g. 48–49% solution) for a few seconds to remove any oxides from the surface to be etched.

Meanwhile, an etchant solution is prepared by first forming a first solution by admixing preselected amounts of chromium dioxide with water. Preferably, the first solution is admixed in substantially equal parts of chromium trioxide (e.g. 100 grams) in distilled water (e.g. 100 milliliters). Preparation of the etchant solution is completed by adding to the first solution just prior to use predetermined amounts of a given hydrofluoric acid solution. Preferably the hydrofluoric acid solution is a 48–49% solution and is added in amounts of substantially one part (e.g. 100 milliliters) for each two parts of the first solution. The presence of hydrofluoric acid causes the etching solution to deteriorate; therefore, it is critical that the hydrofluoric acid be added just before the etchant solution is to be used.

Body 10 with first electrode 21, with masking layer 23 in place, is then immersed in the etchant solution, while the etchant solution is agitated relative to body 10. A slant-rotating table assembly, such as that known in the art, has been found satisfactory for providing the agitation. The etching is continued for a preselected period of time of preferably between 5 to 10 minutes, with 7 minutes being a most desired time period. The etching causes radiation reflecting etch pits 24 to form in the exposed portion of first major surface 11 at opening 22 and in turn form light radiation reflective means 25.

The angle of the reflective surfaces of the light radiation reflecting etch pits is selected after certain considerations. The angle can be chosen such that the critical angle for the wavelength of the radiation used in the silicon is exceeded, or alternatively by applying highly reflective metal to the etch pits.

The refractive index in silicon for light radiation of wavelengths in the portion of the light spectrum suitable for penetration (i.e. 0.9 to 1.1 microns) is about 3.5. Accordingly, the angle of the surfaces of etch pits 24 for optimum reflection has been found to be about 16.5° to 17° to the normal to the major surface 11, which is also the nominal icident direction of the activating light radiation. When the light radiation is incident to a silicon surface from within the silicon crystal at an angle greater than 16.5° to the normal to the surface, the radiation will totally reflect. The angle of the reflective surfaces of etch pits 24 is not, however, critical when a reflective metal deposition is utilized as hereinafter described.

In any event, the angles of the reflective surfaces of etch pits are preferably controlled to provide best reflection for light of a given wavelength through the widest possible area of a controlled rectifier of given thickness and width, see U.S. Pat. No. 3,590,344 for further description. By controlling the composition of the etchant solution and the crystallographic orientation of major surface 11, the angle of the reflective surfaces of etch pits 24 can be controlled to provide better internal reflection of light radiation. In addition, the crystallographic orientation of major surface 11 is preferably (111) so that etch pits 24 form in a preferred tetrahedral pattern for best light reflection. Accordingly, the etch pits are suitable for total reflection of the incident radiation and provide better utilization of the light radiation in initially turning-on the thyristor over the largest area. After etching, body 10 is removed from the etchant solution and rinsed in deionized water.

Figure 3:
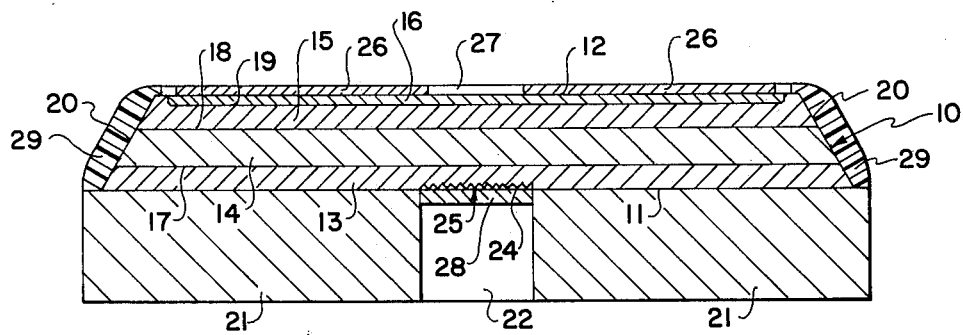

Referring to FIG. 3, masking layer 23 of hydrofluoric acid resistant material is removed from surfaces 12 and 20 with a suitable solvent, and surfaces 12 and 20 are again cleaned by standard cleaning procedures.

Second electrode 26 is then formed on second major surface 12 to make ohmic contact with cathode-emitter region 16, while leaving opening 27 therethrough corresponding to light radiation reflective means 25 in opposite portions of major surface 11.

Figure 4:
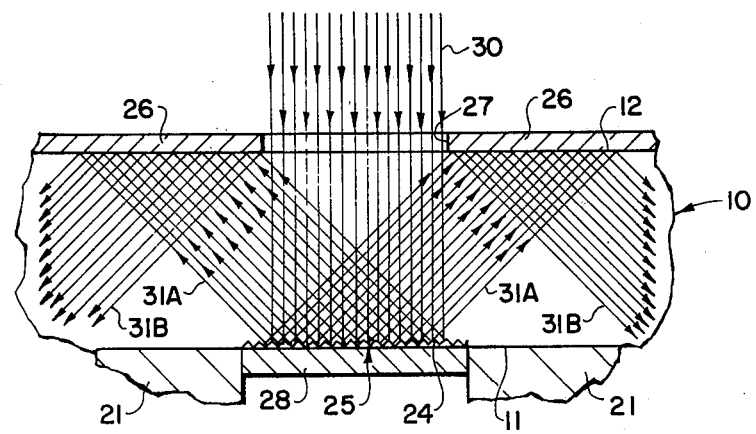
FIG. 4 is a partial cross-sectional view in elevation showing the operation of the light-activated semiconductor controlled rectifier of FIGS. 1 through 3.

Second electrode 26 may be of any suitable metal such as aluminum and is preferably formed by vapor or sputter deposition to a thickness typically between 70,000 and 100,000 A. Preferably, electrode 26 is also of a material that will internally reflect substantial amounts of light to aid in the operation of the controller rectifier as shown in FIG. 4. Electrode 26 is selectively formed as above described by selective deposition through a suitable metal mask or alternatively, by deposition over the entire surface followed by selective removal of the metal layer by standard photolithographic masking and etching techniques. As formed, electrode 26 typically makes a low resistance ohmic contact to cathode-emitter region 16.

Preferably, also formed over light radiation reflective means 25 is an opaque layer 28 of light reflective material such as aluminum of, for example, 70,000 to 100,000 A in thickness. Light reflecting layer 28 assists in reflecting the light radiation from reflective means 25 back into the silicon body 10 to provide better utilization of the incident light radiation in initially turning on the rectifier over the largest possible area. Also by this means the angles of the reflective surfaces of pits 25 of reflective means 25 are not as critical to good turn-on operation of the controlled rectifier. Preferably, light reflecting layer 28 is applied to light radiation reflective means 25 simultaneously with the forming of second electrode 26.

The semiconductor controlled rectifier is completed by coating side surfaces 20 with a suitable passivating layer 29. Material particularly suitable for this purpose is 1,2-dihydroxyanthraquinone (also called "alizarin") alone or in a silicone or epoxy resin. Passivating layer 29 substantially reduces atmospheric effects on the semiconductor body.

Referring to FIG. 4, the operation of the semiconductor controlled rectifier shown in FIG. 3 is illustrated. The operation of the device is dependent upon selecting a light source for generating light radiation 31 of sufficient intensity and proper wavelength, as well as the formation of etching pits with reflective surfaces at proper angles for the light radiation reflective means. One satisfactory light radiation source for use in this device is a neodymium-doped rod laser generating light radiation having a wavelength of 1.06 microns. Examples of rod laser materials are glass, yttrium-aluminum-garnet, and calciumfluorophosphate and soap.

Light radiation 31 impinges on major surface 12 through opening 27 in cathode electrode 26, and partially penetrates through body 10 to light radiation reflective means 25 as shown by the arrows in FIG. 4. At reflective means 25, the light radiation is reflected from reflective surfaces of etch pits 24 at an angle back toward major surface 12 as shown by arrows 31A. When the reflected light radiation strikes major surface 12 under cathode electrode 26, it is again reflected back into body 10 toward major surface 11 as shown by arrows 31B. The controlled rectifier can thereby be turned-on with a minimal amount of lateral current flow.

The characteristic absorption depth of suitable light radiation for the present invention is radiation which will penetrate silicon to between 300 and 500 microns. The radiation from neodymium-doped lasers is attenuated by 67% passing through a thickness of about 300 to 500 microns of silicon. For power semiconductor devices, body 10 of silicon typically varies in thickness from 125 microns to 500 microns. Accordingly, given a radiation beam with sufficient energy, the radiation can reflect through the silicon body thickness several times as shown by arrows 31A and 31, to generate a sufficient number of electron-hole pairs through the body to actuate a substantial area of the device.

Figure 5:
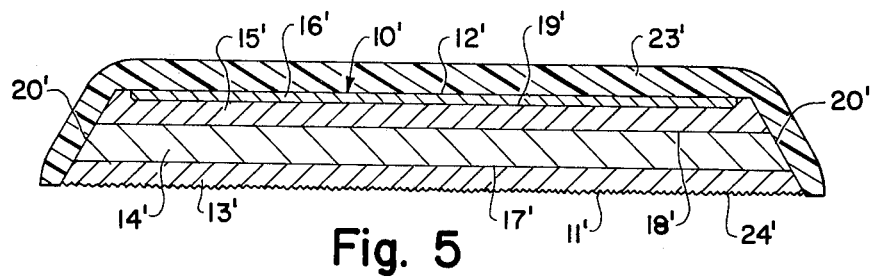
FIGS. 5 through 7 are cross-sectional views in elevation of a light-activated semiconductor controlled rectifier in various stages of fabrication in accordance with an alternative embodiment of the present invention.
Figure 8:
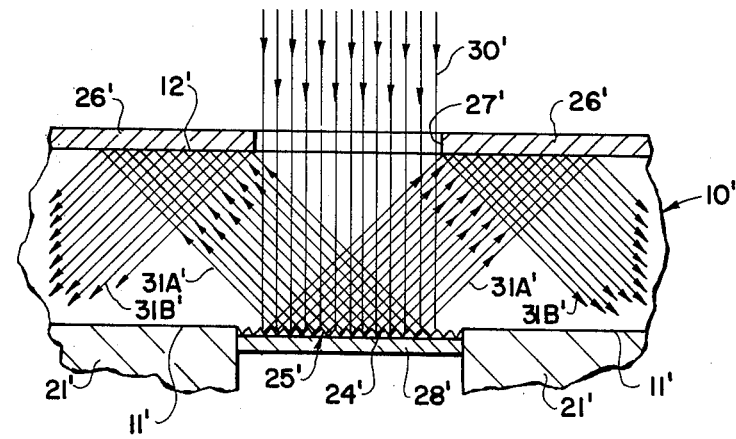
FIG. 8 is a partial cross-sectional view showing the operation of the light-activated semiconductor controlled rectifier of FIGS. 5 through 7.

Referring to FIGS. 5 and 8, an alternative method of making a light activated semiconductor controlled rectifier is shown. In this method the controlled rectifier structure is provided in silicon body 10' as above described in connection with FIG. 1, preferably by diffusion. Four impurity regions 13', 14', 15' and 16' of alternate type conductivity are thus disposed alternately through body 10' between major surfaces 11' and 12', with PN junctions 17', 18' and 19' formed between regions 13' and 14', 14' and 15', 15' and 16', respectively. Again, impurity regions 13' and 16' adjoin major surfaces 11' and 12', respectively, and form the anode-emitter and cathode-emitter regions, respectively, while impurity regions 14' and 15' are disposed intermediately and form the anode-base and the cathode-base region, respectively.

Body 10 (with the controlled rectifier formed therein), then has major surface 12' and side surface 20' covered with masking layer 23'. Masking layer 23' is again a material resistant to hydrofluoric acid such as Apiezon$^{TM}$ wax. The entire major surface 11' is left exposed, and extended time and labor is not lost in masking select portions of major surface 11' to provide for etching only in the portion of said surface where the light-radiation reflective means is desired.

Body 10', so masked, is then immersed in an etchant solution prepared as above described in connection with FIG. 2. Again, the etching solution is agitated relative to the body while the immersion continues. The immersion continues preferably for between 5 and 10 minutes, and most desirably 7 minutes, to etch radiation reflecting etch pits 24' over the entire exposed surface 11'. Again, the crystallographic orientation of major surface 11' is preferably (III) so that etch pits 24' form in the preferred tetrahedral pattern for best light reflection.

Figure 6:
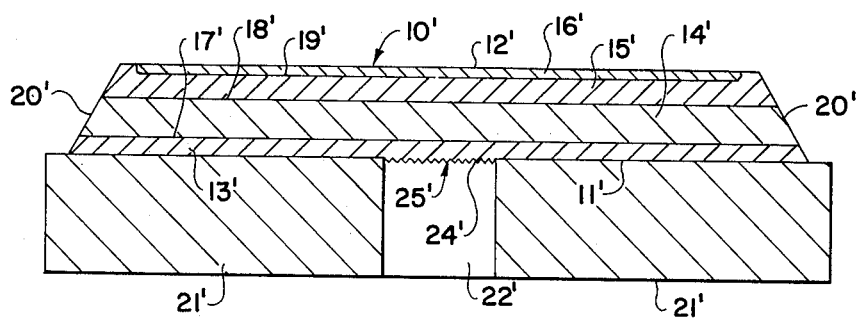

Referring to FIG. 6, masking layer 23' is removed and the surfaces of body 10' are cleaned by standard procedures. Body 10' is then disposed with major surface 11' in intimate contact with a planar surface of anode electrode 21', usually of molybdenum or tungsten. Electrode 21' has opening 26' throughout corresponding in size to a desired light radiation reflective means. Body 10' is then alloyed to electrode 21' by heating in an inert atmosphere to a temperature typically of about 680°C. to bond body 10' to electrode 21' and make a low resistant ohmic contact between anode-emitter region 13' and anode electrode 21'. During the alloying, etch pits 24' are degraded and alloyed into electrode 21' everywhere over surface 11' except at opening 22', where the desired light radiation reflective means 25' is desired.

Figure 7:
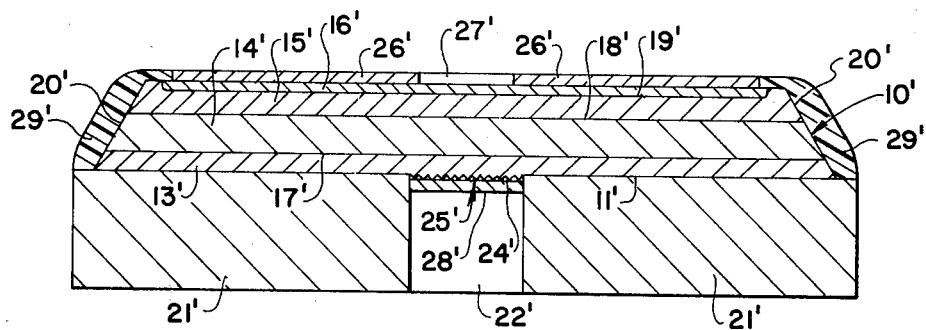

Referring to FIG. 7, second electrode 26', preferably of aluminum, is formed on second major surface 12' by standard vapor or sputter deposition techniques to a thickness of typically 70,000 to 100,000 A. Again, the second electrode may be selectively deposited through a metallic deposition mask, or indiscriminately deposited followed by selectively removing the metal by standard photolithographic masking and etch techniques. In any event, second electrode is formed with typically central opening 27' therethrough corresponding to light radiation reflective means 25' in opposite first major surface 11'. The second electrode makes a low resistant ohmic contact with cathodeemitter region 16'.

Preferably, light reflecting layer 28' of a light reflecting material is again formed over light radiation reflective means 25' to assist in reflecting the light radiation from reflective means 25' back into body 10' and reduce the criticality of the angle of light reflective surfaces of pits 24' of reflective means 25'. Preferably, reflecting layer 28' is of the same material and thickness as second electrode 26' and is formed simultaneously with second electrode 26'.

The light activated semiconductor controlled rectifier is then finished by coating side surfaces 20' with passivating layer 29' typically of 1,2-dihydroxyanthraquinone alone or in a silicone or epoxy resin.

Referring to FIG. 8, the operation of the resulting light activated controlled rectifier is shown to be again similar to the rectifier of FIGS. 1-4. Suitable light radiation 30' is incident on the controlled rectifier through opening 29' of second electrode 26' and penetrates through body 10' to be reflected from reflective means 25'. The light radiation is thus reflected internally and outwardly through body 10' as shown by arrows 31A' and 31B', creating electron-hole pairs throughout a large area of the controlled rectifier for initial turn-on, providing high di/dt capability for the device.

Figure 9:
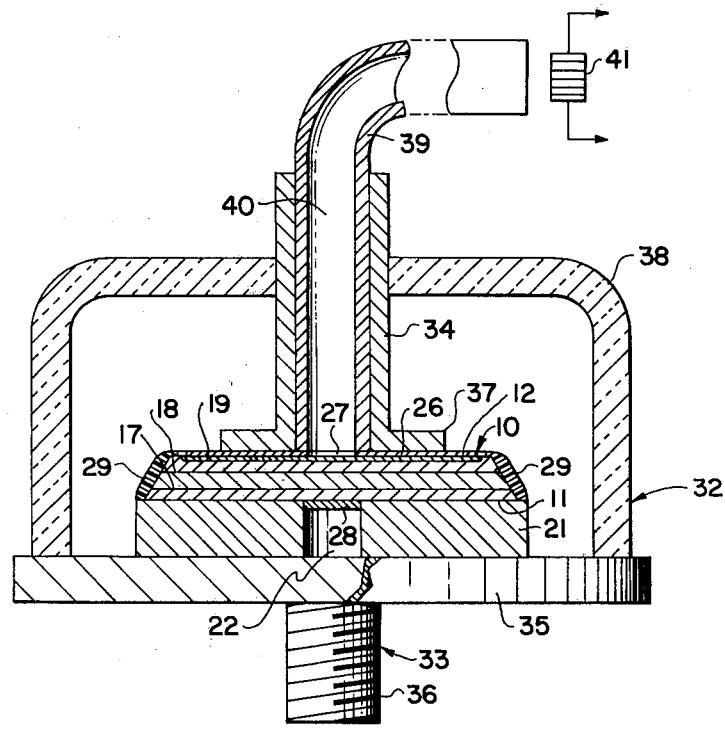
FIG. 9 is a side view in cross-section of a light-activated device incorporating a light-activated semiconductor controlled rectifier as shown in FIG. 3.

Referring to FIG. 9, the light activated semiconductor controlled rectifier can be packaged in a light activated device as there shown. This packaging is, however, illustrative only; the light activated controlled rectifier of the present invention is equally adapted to flat package type devices.

As shown specifically in FIG. 9, the light activated semiconductor controlled rectifier as above described (e.g. in FIG. 3) is positioned between two terminals 33 and 34, which are adapted for connection to an electrical power source (not shown). Lower terminal 33 of a highly electrically conductive material, such as copper, has a flat portion 36 adapted to make intimate bonding contact with anode electrode 21 over a flat surface, and integral threaded stud portion 36 adapted for connection to a heat sink or the like. Upper terminal 34, also of copper or some other highly electrically conductive material, has a flat portion 37 adapted to make intimate bonding contact with cathode electrode 26, and an integral tubular portion 39 extending centrally through cup-shaped ceramic insulator 38. Ceramic insulator 38 in turn surrounds the controlled rectifier and is hermetically sealed to terminals 33 and 34.

Inside tubular portion 39 of terminal 34 is an inner tubular member and light pipe 40, which has an end portion abutted against major surface 12 at opening 27 in cathode electrode 36. Light pipe 40 is thus adapted to conduct light radiation suitable to activate the controlled rectifier from a light source 41, which typically is a gallium arsenide laser, to the controlled rectifier and enable the light radiation to penetrate the controlled rectifier so as to reflect from the light radiation reflective means 24 through body 10.

While the presently preferred embodiments of the invention and methods of performing them have been specifically described, it is distinctly understood that the invention may be otherwise variously embodied and used within the scope of the following claims. For example, although the N-type and P-type regions are preferably formed by diffusion, epitaxial growth or a combination of epitaxial growth and diffusion may be utilized in forming the conductive regions in the silicon semiconductor body.

What is claimed is:

1. A method of making a light activated semiconductor controlled rectifier comprising the steps of:
   A. sequentially providing in a silicon semiconductor body, having first and second opposed major surfaces, impurities to form in the body four regions of alternate type conductivity disposed alternately through the body between the major surfaces with a PN junction between each region, the two regions adjoining the major surfaces being emitter regions and the two intermediate regions being base regions;
   B. masking all surfaces except first major surface of the semiconductor body with a material resistant to hydrofluoric acid;
   C. preparing an etchant solution by forming a first solution by admixing predetermined amounts of chromium trioxide and water, and adding to said first solution just prior to use predetermined amounts of a given hydrofluoric acid solution;
   D. immersing the masked semiconductor body in the etchant solution for a preselected period of time, while agitating the solution relative to the body, to form light radiation reflecting etch pits in at least a portion of the first major surface;
   E. forming on the first major surface a first electrode making contact to the emitter region adjoining the first major surface and having an opening therethrough corresponding to a light radiation reflective means for the body on the first major surface;
   F. removing from the surfaces of the semiconductor body the material resistant to hydrofluoric acid;
   G. forming on the second major surface a second electrode making ohmic contact to the emitter region adjoining the second major surface and having an opening therethrough adapted to permit light radiation of preselected wavelengths to penetrate the body and reflect from the light radiation reflective means.

2. A method of making a light activated semiconductor controlled rectifier as set forth in claim 1 wherein:
   the step of forming the first electrode on the first major surface is performed before the step of immersing the masked semiconductor body in the etchant solution to form, on immersion of the body in the etchant solution, the light radiation reflecting etch pits only on preselected portions of the first major surface corresponding to the light radiation reflective means.

3. A method of making a light activated semiconductor controlled rectifier as set forth in claim 1 wherein:
   the step of forming the first electrode on the first major surface is performed after the step of immersing the masked semiconductor body in the etchant to form the light radiation reflecting etch pits over the first major surface on immersion of the body in the etchant solution.

4. A method of making a light activated semiconductor controlled rectifier as set forth in claim 1 comprising in addition:
   forming a light reflecting material on the first major surface at the light radiation reflective means to assist in reflection of light radiation from the reflective means.

5. A method of making a light activated semiconductor controlled rectifier as set forth in claim 4 wherein:
   the light reflecting material is applied simultaneously with the forming of the second electrode.

6. A method of making a light activated semiconductor controlled rectifier comprising the steps of:
   A. sequentially providing in a silicon semiconductor body, having first and second opposed major surfaces, impurities to form in the body four regions of alternate type conductivity disposed alternately through the body between the major surfaces with a PN junction between each region, the two regions adjoining the major surfaces being emitter regions and the two intermediate regions being base regions;
   B. maksing all surfaces except first major surface of the semiconductor body with a material resistant to hydrofluoric acid;

C. preparing an etchant solution by forming a first solution by admixing substantially equal parts of chromium trioxide and water, and adding to said first solution just prior to use substantially one part of a hydrofluoric acid solution of substantially equal parts of acid and water for each two parts of said first solution;

D. immersing the masked semiconductor body in the etchant solution for a preselected period of time, while agitating the solution relative to the body, to form light radiation reflecting etch pits in at least a portion of the first major surface;

E. forming on the first major surface a first electrode making ohmic contact to the emitter region adjoining the first major surface and having an opening therethrough corresponding to a light radiation reflective means for the body on the first major surface;

F. removing from the surfaces of the semiconductor body the material resistant to hydrofluoric acid;

G. forming on the seond major surface a second electrode making ohmic contact to the emitter region adjoining the second major surface and having an opening therethrough adapted to permit light radiation of preselected wavelengths to penetrate the body and reflect from the light radiation reflective means.

7. A method of making a light activated semiconductor controlled rectifier as set forth in claim 6 wherein: the step of forming the first electrode on the first major surface is performed before the step of immersing the masked semiconductor body in the etchant solution to form the light radiation reflecting etch pits only on preselected portions of the first major surface corresponding to the light radiation reflective means on immersion of the body in the etchant solution.

8. A method of making a light activated semiconductor controlled rectifier as set forth in claim 6 wherein: the step of forming the first electrode on the first major surface is performed after the step of immersing the masked semiconductor body in the etchant to form the light radiation reflecting etch pits over the entire surface of the first major surface on immersion of the body in the etchant solution.

9. A method of making a light activated semiconductor controlled rectifier as set forth in claim 6 comprising in addition:

forming a light reflecting material on the first major surface at the light radiation reflective means to assist in reflection of light radiation from the reflective means.

10. A method of making a light activated semiconductor controlled rectifier as set forth in claim 9 wherein:

the light reflecting material is applied simultaneously with the forming of the second electrode.

* * * * *